US00RE49365E

(19) United States
(12) Reissued Patent
Kononchuk et al.

(10) Patent Number: US RE49,365 E
(45) Date of Reissued Patent: Jan. 10, 2023

(54) STRUCTURE FOR RADIO-FREQUENCY APPLICATIONS

(71) Applicant: Soitec, Bernin (FR)

(72) Inventors: Oleg Kononchuk, Theys (FR); William Van Den Daele, Grenoble (FR); Eric Desbonnets, Lumbin (FR)

(73) Assignee: Soitec, Bernin (FR)

(21) Appl. No.: 16/920,274

(22) Filed: Jul. 2, 2020

Related U.S. Patent Documents

Reissue of:
(64) Patent No.: 10,347,597
Issued: Jul. 9, 2019
Appl. No.: 15/500,721
PCT Filed: Jul. 3, 2015
PCT No.: PCT/FR2015/051854
§ 371 (c)(1),
(2) Date: Jan. 31, 2017
PCT Pub. No.: WO2016/016532
PCT Pub. Date: Feb. 4, 2016

(30) Foreign Application Priority Data

Aug. 1, 2014 (FR) ..... 1401800

(51) Int. Cl.
*H03H 3/02* (2006.01)
*H03H 3/08* (2006.01)
(Continued)

(52) U.S. Cl.
CPC ..... *H03H 3/08* (2013.01); *H01L 23/66* (2013.01); *H01L 21/306* (2013.01);
(Continued)

(58) Field of Classification Search
CPC . H01L 23/66; H01L 21/306; H01L 21/76251; H01L 41/402; H01L 23/49811;
(Continued)

(56) References Cited

U.S. PATENT DOCUMENTS 6,255,731 B1 * 7/2001 Ohmi ..... H01L 21/2007 257/751
8,481,405 B2 * 7/2013 Arriagada ..... H01L 21/302 438/455
(Continued)

FOREIGN PATENT DOCUMENTS

CN 1856873 A 11/2006
CN 103168342 A 6/2013
(Continued)

OTHER PUBLICATIONS

Kononchuk ET AL., Silicon-on-insulator (SOI) Technology, manufacture and applications, applications, points 10.7 and 10.8, from Woodhead Publishing, 2014, abstract only.
(Continued)

*Primary Examiner* — Tuan H Nguyen
(74) *Attorney, Agent, or Firm* — TraskBritt

(57) ABSTRACT

A structure for radiofrequency applications includes: a support substrate of high-resistivity silicon comprising a lower part and an upper part having undergone a p-type doping to a depth D; a mesoporous trapping layer of silicon formed in the doped upper part of the support substrate. The depth D is less than 1 micron and the trapping layer has a porosity rate of between 20% and 60%.

44 Claims, 2 Drawing Sheets

(a)

(b)

(51) Int. Cl.

| | |
|---|---|
| ***H01L 23/06*** | (2006.01) |
| ***H01L 41/04*** | (2006.01) |
| ***H01L 21/306*** | (2006.01) |
| ***H01L 21/762*** | (2006.01) |
| ***H01L 23/66*** | (2006.01) |
| *H01L 21/322* | (2006.01) |

(52) U.S. Cl.
CPC .... *H01L 21/3226* (2013.01); *H01L 21/76251* (2013.01); *H01L 41/042* (2013.01); *H03H 3/02* (2013.01)

(58) Field of Classification Search
CPC ..... H01L 27/14618; H01L 27/14621; H03H 3/02; H03H 3/08
See application file for complete search history.

(56) References Cited

U.S. PATENT DOCUMENTS

| | | | | |
|---|---|---|---|---|
| 2004/0152276 | A1 | 8/2004 | Nishimura | |
| 2005/0128255 | A1* | 6/2005 | Nakanishi | B41J 2/161 347/68 |
| 2006/0234477 | A1 | 10/2006 | Gadkaree | |
| 2007/0032040 | A1 | 2/2007 | Lederer | |
| 2013/0294038 | A1 | 11/2013 | Landru et al. | |
| 2014/0212982 | A1* | 7/2014 | Moewes | G01N 23/223 436/107 |

FOREIGN PATENT DOCUMENTS

| | | | |
|---|---|---|---|
| EP | 0969522 | A1 | 1/2000 |
| EP | 0975012 | A2 | 1/2000 |
| FR | 2977070 | A1 | 12/2012 |
| FR | 2977075 | A1 | 12/2012 |
| JP | 05-217821 | A | 8/1993 |
| JP | 11-103035 | A | 4/1999 |
| JP | 2004-221285 | A | 8/2004 |
| JP | 2006-229282 | A | 8/2006 |
| JP | 2007-507093 | A | 3/2007 |
| JP | 2012164906 | A | 8/2012 |
| JP | 2013-543276 | A | 11/2013 |

OTHER PUBLICATIONS

International Search Report for International Application No. PCT/FR2015/051854 dated Dec. 3, 2015, 3 pages.
International Written Opinion for International Application No. PCT/FR2015/051854 dated Dec. 3, 2015, 5 pages.
CN Office Action dated Jan. 22, 2019 for CN Application No. 201580041382, 10 pages.

* cited by examiner

STRUCTURE FOR RADIO-FREQUENCY APPLICATIONS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*Notice: This is a reissue application of U.S. Pat. No. 10,347,597 B2, issued Jul. 9, 2019, to Kononchuk et al. for STRUCTURE FOR RADIO-FREQUENCY APPLICATIONS.*

CROSS-REFERENCE TO RELATED APPLICATIONS

This application is a national phase entry under 35 U.S.C. § 371 of International Patent Application PCT/FR2015/051854, filed Jul. 3, 2015, designating the United States of America and published as International Patent Publication WO 2016/016532 A1 on Feb. 4, 2016, which claims the benefit under Article 8 of the Patent Cooperation Treaty to French Patent Application Serial No. 14/01800, filed Aug. 1, 2014.

TECHNICAL FIELD

The present application relates to the field of integrated radiofrequency devices.

BACKGROUND

Integrated devices are usually created on substrates in the form of wafers, which are used mainly as support for the fabrication thereof. However, the increasing degree of integration and the increasing performance levels expected of these devices is driving an increasingly significant coupling between their performance levels and the characteristics of the substrate on which they are formed. That is particularly the case with radiofrequency (RF) devices, processing signals with a frequency of between approximately 3 kHz and 300 GHz, the applications of which notably fall within the field of telecommunications (cellular telephones, WI-FI®, BLUETOOTH®, etc.).

As an example of device/substrate coupling, the electromagnetic fields, deriving from the high-frequency signals propagating in the devices, penetrate into the depth of the substrate and interact with any charge carriers located therein. This causes problems of nonlinear distortion (harmonics) of the signal, a pointless consumption of a portion of the energy of the signal by insertion loss and possible influences between components.

Thus, the RF devices have characteristics governed both by their architecture and their creation processes, and by the capacity of the substrate on which they are fabricated to limit the insertion losses, the cross-talks between neighboring devices, and the nonlinear distortion phenomena generating harmonics.

The radiofrequency devices, such as antenna switches, tuners and power amplifiers, can be created on different types of substrates.

Silicon-on-sapphire substrates are, for example, known, commonly called SOS (silicon-on-sapphire), which give the components, created according to microelectronic technologies in the surface layer of silicon, the benefit of the insulating properties of the sapphire substrate. For example, the antenna switches and power amplifiers fabricated on this type of substrate exhibit very good figures of merit but are primarily used for niche applications because of the overall cost of the solution.

Also known are the substrates based on high-resistivity silicon comprising a support substrate, a trapping layer arranged on the support substrate, a dielectric layer arranged on the trapping layer, and an active semiconductive layer arranged on the dielectric layer. The support substrate usually exhibits a resistivity higher than 1 k ohm·cm. The trapping layer can comprise non-doped polycrystalline silicon. The combination of a high-resistivity support substrate and of a trapping layer according to the prior art makes it possible to reduce the above-mentioned device/substrate coupling and thus ensure good performance levels in the RF devices. In this respect, a person skilled in the art will find a review of the performance levels of the RF devices fabricated on the high-resistivity semiconductive substrate known from the prior art in "Silicon-on-insulator (SOI) Technology, manufacture and applications," points 10.7 and 10.8, Oleg Kononchuk and Bich-Yen Nguyen, from Woodhead Publishing.

Nevertheless, a trapping layer of polysilicon presents the drawback of undergoing a partial recrystallization in high-temperature heat treatment steps, which contributes to diminishing the trap density in the layer. With the trend in mobile telephone standards dictating increasingly demanding specifications in the RF components, the degradation of the performance of the device linked to this decrease in trap density is prohibitive for some applications.

Moreover, the step of deposition of the polysilicon and of surface preparation in order to produce the stacking of the substrate are sensitive and expensive.

An alternative to this trapping layer of polysilicon is a layer of porous silicon. A deposition of a porous layer, according to the prior art, does not make it possible to obtain a very thin layer thickness, less than 1 μm. Thus, the porous layers of the prior art and their thickness, between 10 μm and 80 μm, do not make it possible to obtain a substrate comprising a porous layer with a mechanical strength that is sufficient to withstand certain steps of fabrication of the devices and be retained in the final functional devices.

BRIEF SUMMARY

An object of the disclosure is, therefore, to propose a structure suitable for radiofrequency applications, remedying the drawbacks of the prior art. An object of the disclosure is notably to propose an integrated structure that meets the increasing demands of the RF applications and that allows for a reduction in fabrication costs.

The disclosure relates to a structure for radiofrequency applications comprising:

- a support substrate of high-resistivity silicon comprising a lower part and an upper part having undergone a p-type doping to a depth D; and
- a mesoporous trapping layer of silicon formed in the doped upper part of the support substrate.

According to the disclosure, the structure is noteworthy in that the depth D is less than 1 μm and the trapping layer has a porosity rate of between 20% and 60%.

The porosity rate of the trapping layer thus obtained makes it possible to accurately control its resistivity, at levels that can be high (>5000 ohm·cm). Thus, the setting of the porosity rate (according to a precise range from 20% to 60%) and of the depth D (less than 1 μm) of the doping of the upper part of the support substrate of silicon in which the trapping layer will be formed, make it possible:

- to ensure a good mechanical strength of the mesoporous layer, allowing it to be retained in the final functional device;
- and to confer properties of resistivity and of insulation on the structure that are appropriate for radiofrequency applications.

Moreover, the fabrication of a very thin mesoporous trapping layer (less than 1 μm) simplifies the step of deposition of the trapping layer on the support substrate, as well as the potential steps of surface preparation necessary for the subsequent process steps to be carried out.

According to advantageous features of the disclosure, taken alone or in combination:

- the mesoporous trapping layer has pores with a diameter of between 2 nm and 50 nm;
- the mesoporous trapping layer is obtained by a process of electrolysis of the doped upper part of the support substrate;
- the electrolysis process is controlled by a technique of voltage control at the terminals of the electrolysis;
- the resistivity of the lower part of the support substrate is greater than 1000 ohm·cm.

According to other advantageous features of the disclosure, taken alone or in combination:

- an active layer is arranged on the trapping layer;
- the active layer is transferred onto the trapping layer by direct bonding;
- the active layer is formed from a semiconductive material;
- the active layer is formed from a piezoelectric material;
- the active layer comprises at least one of the materials selected from the following group: silicon, silicon carbide, silicon germanium, lithium niobate, lithium tantalate, quartz, and aluminum nitride;
- the thickness of the active layer is between 10 nm and 50 μm;
- a dielectric layer is arranged between the trapping layer and the active layer;
- the dielectric layer is transferred onto the trapping layer by direct bonding;
- the dielectric layer comprises at least one of the materials selected from the following group: silicon dioxide, silicon nitride, and aluminum oxide;
- the dielectric layer is between 10 nm and 6 μm;
- a layer of silicon nitride (SiN) is arranged between the trapping layer and the dielectric layer.

According to other advantageous features of the disclosure, taken alone or in combination, at least one microelectronic device is present on or in the active layer:

- the microelectronic device is a switching circuit or an antenna tuning circuit or a radiofrequency power amplification circuit;
- the microelectronic device comprises a plurality of active components and a plurality of passive components;
- the microelectronic device comprises at least one control element and one MEMS switching element consisting of a microswitch with ohmic contact or of a capacitive microswitch;
- the microelectronic device is a radiofrequency filter operating by bulk or surface acoustic wave propagation.

BRIEF DESCRIPTION OF THE DRAWINGS

Other features and advantages of the disclosure will emerge from the following detailed description with reference to the attached figures in which.

DETAILED DESCRIPTION

Figure 1:
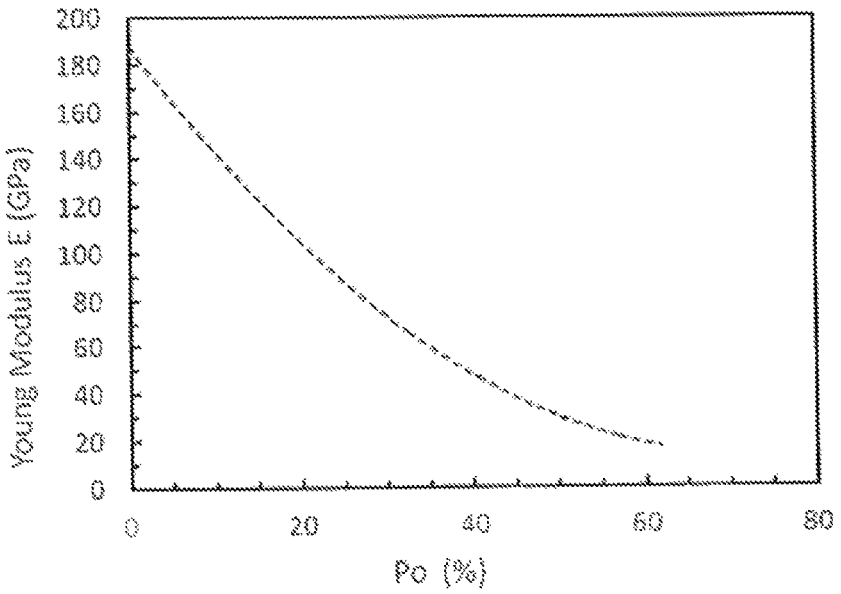
FIG. 1 represents the dependency of the Young's modulus with the porosity of the silicon.

The structure 1, 1', 11 for radiofrequency applications according to the disclosure comprises a support substrate 2 of high-resistivity (HR) silicon. High resistivity should be understood to mean a resistivity higher than 1000 ohm·cm; it is advantageously between 4000 and 10,000 ohm·cm.

The support substrate 2 of HR silicon undergoes a p-type doping on an upper part 3 and to a predetermined depth D, less than 1 μm, in accordance with the disclosure. This doping can advantageously be performed by ion implantation followed by a bake of RTA type to activate the implanted p-type dopants, or an epitaxy of a p+ layer, or even a doping by "spin-on-glass" (the term describing a deposition of a layer of glass by centrifugation).

Thus doped, the upper [layer] *part* 3 of the support substrate 2" of HR silicon is subjected to a process of electrolysis, so as to transform the upper part 3 of the support substrate 2 into a porous *trapping* layer 4, which will form the trapping layer 4. The depth D of the dopants introduced previously into the upper part 3 of the support substrate 2 corresponds substantially to the thickness of the trapping layer 4.

The process of electrolysis can consist for example of an electrochemical anodization, in which at least the upper part 3 of the support substrate 2 is placed in a chamber comprising an electrolyte, such as hydrofluoric acid. An anode and a cathode are then dipped into the electrolyte and powered by a source of electrical current.

There are three types of morphologies for porous silicon:

- macroporous silicon, generally obtained from weakly doped n-type silicon, and having a pore diameter greater than 50 nm;
- mesoporous silicon, generally obtained from strongly doped p-type silicon, and having a pore diameter of between 2 nm and 50 nm;
- nanoporous (also called microporous) silicon, generally obtained from weakly doped p-type silicon, and having a pore diameter of less than 2 nm.

Thus, depending on the level of doping of the *support* substrate 2 and the conditions of the electrolysis process, such as the adjustment of the electrical current density applied by the source of electrical current, the porosity rate will be higher or lower and controlled. To recap, the porosity Po of a layer is defined as the fraction of bulk unoccupied within the layer and is expressed as:

$$Po=(d-d_{Po})/d$$

where d is the density of the non-porous material and $d_{Po}$ is the density of the porous material.

The trapping layer 4 generated has to have a porosity rate that is sufficient to obtain a high defect density, suitable for trapping the inversion charges generated in the support substrate 2, and a high resistivity level. However, this porosity rate, coupled with the thickness of the porous *trapping* layer 4, also characterizes the mechanical strength of the trapping layer 4. The dependency of the Young's modulus (denoted E and expressed in GigaPascal) as a function of the porosity rate of the porous layer is represented in FIG. 1. For a given thickness, the greater the porosity rate, the lower the mechanical properties: the decrease in the Young's modulus as a function of the porosity percentage (Po) reflects this decrease in mechanical strength. Furthermore, for a given porosity rate, the thicker the porous layer, the lower the mechanical properties. The applicant has identified a process window for which the porous layer exhibits the mechanical strength required to be compatible with subsequent microelectronic steps (deposition, bakes, polishing, etc.), as well as the resistivity properties required for the radiofrequency applications.

The structure 1, 1', 11 according to the disclosure, therefore, proposes a trapping layer 4 with a porosity rate that is between 20% and 60% and with a thickness that is less than 1 μm, so as to ensure mechanical and electrical performance levels of the structure 1, 1', 11. The mesoporous morphology, having pores with a diameter of between 2 nm and 50 nm, makes it possible to achieve the requisite porosity levels, over the thickness of 1 μm, with a significant trap density (typically greater than $10^{13}/cm^2$, making it possible to trap the inversion charges) and a high resistivity.

The thickness D of the trapping layer 4 (of mesoporous silicon) depends on the depth of the p-type doping of the upper part 3 of the support substrate 2. The porosity rate depends on the quantity of dopants introduced into the upper part 3 of the support substrate 2 as well as the electrolysis process performance conditions.

In order to ensure that the porosification by electrolysis of the upper part 3 of the support substrate 2 does not exceed the predetermined depth D, a control of the voltage at the terminals of the electrolysis is put in place, making it possible to determine when the porosification begins in the non-doped lower part of the support substrate 2 of HR silicon and, therefore, stop the electrolysis process. The porosification of the upper part 3 of the support substrate 2 has to be stopped at the end of the diffusion tail of the dopants introduced into the upper part 3 of the *support* substrate 2, substantially at the depth D.

The structure 1, 1', 11 for radiofrequency applications according to the disclosure thus comprises a trapping layer 4 of mesoporous silicon, the porosity of which is between 20% and 60% and the thickness of which is less than 1 μm, arranged on a support substrate 2 of high-resistivity silicon. The trapping layer has a typical resistivity greater than 5000 ohm·cm.

Figure 2:
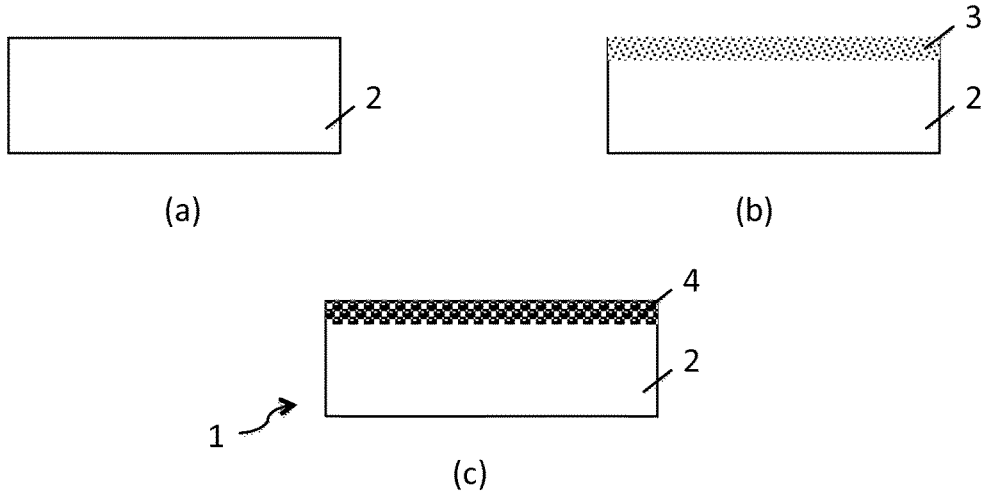
FIG. 2 represents a first embodiment of the disclosure.

According to a first embodiment of the disclosure represented in FIG. 2, the structure 1 for radiofrequency applications can take the form of a wafer of dimensions compatible with microelectronic processes, for example, with a diameter of 200 nm or 300 nm, comprising the support substrate 2 and the trapping layer 4 (FIG. 2, Panel (c)).

The support substrate 2 of HR silicon (FIG. 2, Panel (a)) advantageously has a resistivity greater than 4000 ohm·cm. It first of all undergoes a boron ion implantation, for example, with a dose of $1^e13/cm^2$ and with an energy of 50 keV, followed by a heat treatment at 1000° C. for 5 minutes; a p-doped upper part 3, to a depth of approximately 200 nm, is thus created (FIG. 2, Panel (b)). The support substrate 2 then undergoes an electrolysis: the current density will, for example, be between 10 and 20 $mA/cm^2$ and the electrolysis solution will have an HF concentration of between 10% and 30%. The mesoporous trapping layer 4 of silicon is formed in the doped upper part 3 of the support substrate 2 (FIG. 2, Panel (c)). The porosity obtained, dependent on the quantity of dopants and on the current density applied during the electrolysis, is of the order of 50%; the pores having a size of between 2 and 50 nm. This fabrication process, simple and inexpensive, makes it possible to obtain a structure 1 that exhibits mechanical and electrical properties compatible with the specifications of radiofrequency applications:

- a good mechanical strength making it possible to withstand the various stressful steps of creation of microelectronic components;
- stable insulation properties linked to the high resistivity of the support substrate 2 and to the charge-trapping qualities of the mesoporous trapping layer 4, even after application of the high-temperature heat treatments for the creation of microelectronic components.

Figure 3:
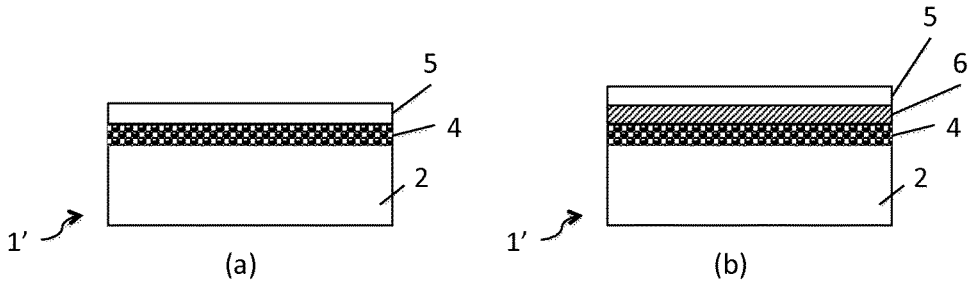
FIGS. 3A and 3B represent a second embodiment of the disclosure.

A second embodiment of the disclosure is represented in FIG. 3. According to a first variant of this second embodiment, illustrated in FIG. 3, Panel (a), the structure 1' for radiofrequency applications can take the form of a wafer and further comprise an active layer 5, arranged on the trapping layer 4, in and on which RF components will be able to be created. The active layer 5 will advantageously be able to consist of semiconductive materials and/or piezoelectric materials. Advantageously, but without this being limiting, the active layer 5 comprises at least one of the materials out of: silicon, silicon carbide, germanium silicon, lithium niobate, lithium tantalate, quartz, aluminum nitride, etc. The thickness of the active layer 5 can vary from a few nanometers (for example, 10 nm) to several tens of microns (for example, 50 μm) depending on the components to be fabricated.

By way of example, the active layer 5 is transferred onto the support substrate 2 comprising the trapping layer 4, by one of the thin layer transfer processes well known to those skilled in the art, including:

- The SMART CUT® process, based on an implantation of light hydrogen and/or helium ions in a donor substrate and a bonding, for example, by molecular adhesion, of this donor substrate directly onto the trapping layer 4, itself arranged on the support substrate 2; a detachment step then makes it possible to separate a thin surface layer from the donor substrate (the active layer), at the level of the embrittlement plane defined by the depth of implantation of the ions. Finishing steps, that can include high-temperature heat treatments, finally confer the crystalline and surface quality required of the active layer 5. The process is particularly suited to the fabrication of thin active layers, with a thickness of between a few nanometers and approximately 1.5 μm, for example, for layers of silicon.
  - The SMART CUT® process is followed by an epitaxy step, making it possible, in particular, to obtain thicker active layers, for example, from a few tens of nm to 20 μm.
  - The direct bonding and mechanical, chemical and/or mechanical-chemical thinning processes involve assembling a donor substrate by molecular adhesion directly on the trapping layer 4, itself arranged on the support substrate 2, then in thinning the donor substrate to the desired thickness of active layer 5, for example, by grinding and by polishing (CMP, "chemical mechanical polishing"). These processes are particularly suited to the transfer of thick layers, for example, from a few microns to several tens of microns, and up to a few hundreds of microns.

According to another variant of the second embodiment, represented in FIG. 3, Panel (b), the structure 1' for radiofrequency applications will also be able to include a dielectric layer 6, arranged between the active layer 5 and the trapping layer 4. Advantageously, but without this being limiting, the dielectric layer 6 will comprise at least one of the materials out of: silicon dioxide, silicon nitride, aluminum oxide, etc. Its thickness will be able to vary between 10 nm and 3 μm.

The dielectric layer 6 is obtained by thermal oxidation or by LPCVD or PECVD or HDP deposition, on the trapping layer 4 or on the donor substrate prior to the transfer of the active layer 5 onto the trapping layer 4.

As is well known in the field of SOI (silicon-on-insulator) substrates for radiofrequency applications, such a dielectric layer, for example, formed by an oxide of silicon on a support substrate of silicon, comprises positive charges. These charges are compensated by negative charges coming from the support substrate at the interface with the dielectric layer. These charges generate a conduction layer in the support substrate, under the dielectric layer, with a resistivity that drops around 10-100 ohm·cm. The electrical performance levels sensitive to the resistivity of the support substrate (such as the linearity of the signal, the level of insertion losses, the quality factors of the passive components, etc.) are, therefore, greatly degraded by the presence of this conduction layer.

The role of the trapping layer 4 is then to trap all the mobile charges generated in the support substrate 2 in order for it to retain a high and stable resistivity level.

Figure 4:
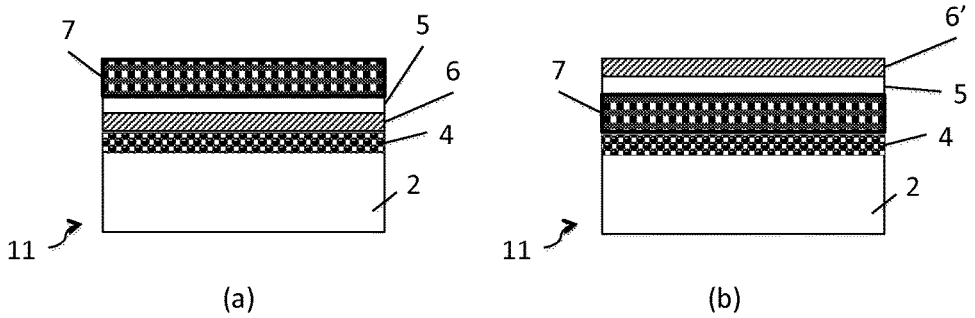
FIG. 4 represents another embodiment of the disclosure.

FIG. 4 presents a third embodiment according to the disclosure. According to a first variant of this third embodiment, represented in FIG. 4, Panel (a), the structure 11 for radiofrequency applications can also comprise or consist of a microelectronic device 7 on or in the active layer 5, which is arranged on a dielectric layer 6 or directly on the trapping layer 4. The microelectronic device 7 can be a switching circuit (called "switch") or an antenna tuning or synchronization circuit (called "tuner") or even a power amplification circuit (called "power amplifier"), created according to silicon microelectronic technologies. The active layer 5 of silicon typically has a thickness of between 50 nm and 180 nm, for example, 145 nm, and the underlying dielectric layer 6 has a thickness of between 50 nm and 400 nm, for example, 200 nm; the trapping layer 4 is arranged between the dielectric layer 6 and the support substrate 2. The microelectronic device 7 created in and on the active layer 5 comprises a plurality of active components (MOS or bipolar type, or the like) and a plurality of passive components (of capacitor, inductor, resistor, resonator, filter type, or the like).

The fabrication of the microelectronic components entails carrying out several steps including high-temperature heat treatments, typically at 950° C.-1100° C., or even higher. The trapping layer 4 of mesoporous silicon described previously retains its physical and electrical properties after such heat treatments.

According to another variant of this embodiment, represented in FIG. 4, Panel (b), the microelectronic device 7 can first of all be created on a substrate of SOI (silicon-on-insulator) type, then transferred by a layer transfer technique known to those skilled in the art onto a structure 1 according to the disclosure comprising the trapping layer 4 arranged on the support substrate 2.

In this particular case, the structure 11 comprises, on the one hand, the support substrate 2 on which the trapping layer 4 is arranged; above the latter, there is the layer of components of the microelectronic device 7: the so-called "back end" part of metal interconnect and dielectric layers is arranged above the trapping layer 4, the so-called "front end" part (silicon), generated partly in the active layer 5, being itself above the "back end" part. Finally, above, there is the active layer 5 and, optionally, a dielectric layer 6'.

In these two particular cases, the electromagnetic fields, deriving from the high-frequency signals intended to be propagated in the *microelectronic* devices 7, and which will penetrate into the trapping layer 4 and into the support substrate 2, will undergo only low losses (insertion losses) and disturbances (cross-talk, harmonics), because of the high and stable resistivity of the support substrate 2 and of the trapping layer 4. Advantageously, the structure 11 according to the disclosure benefits from a process of fabrication of the trapping layer 4 that is simple and economical compared to the prior art; and it offers at least equivalent performance levels.

According to a fourth embodiment, the structure 11 for radiofrequency applications can comprise or consist of a microelectronic device 7 comprising at least one control element and one MEMS (microelectromechanical system) switching element consisting of a microswitch with ohmic contact or of a capacitive microswitch.

The MEMS fabrication can be facilitated by the presence of a dielectric layer under an active layer of silicon. The structure 11 according to the disclosure will, therefore, be able to include, by way of example, an active layer 5 of silicon with a thickness of between 20 nm and 2 microns, advantageously 145 nm, and an underlying dielectric layer 6 with a thickness of between 20 nm and 1 micron, advantageously 400 nm; the trapping layer 4 is arranged between the dielectric layer 6 and the support substrate 2. The fabrication of the MEMS part is then based on surface micromachining techniques, making it possible, in particular, to free beams or mobile membranes in the active layer of silicon.

Alternatively, the MEMS part can be created directly on the trapping layer 4, by successive deposition of a plurality of layers (including an electrode, a dielectric, a sacrificial layer, and an active layer) and by the production of patterns on these different layers.

The microelectronic processes for the fabrication of the control element(s) (CMOS, for example), usually performed before the MEMS part, require, as in the preceding embodiment, the application of high-temperature heat treatments. The mechanical strength of the trapping layer 4 to this type of treatment and its capacity to retain its electrical properties (high resistivity and trap density suitable for trapping the mobile charges) are, therefore, key advantages.

In the same way as for the third embodiment, the high-frequency signals propagated in this *microelectronic* device 7 generate electromagnetic fields that penetrate into the trapping layer 4 and into the support substrate 2. The losses (insertion losses), distortions (harmonics) and disturbances (cross-talk, etc.) will be lesser because of the high and stable resistivity of the support substrate 2 provided with the trapping layer 4.

According to a fifth embodiment, the structure 11 for radiofrequency applications can comprise or consist of a microelectronic device 7 comprising a radiofrequency filter operating by bulk acoustic wave (BAW) propagation.

The fabrication of a BAW filter of FBAR (thin-film bulk acoustic resonator) type necessitates an active layer 5 consisting of a piezoelectric material, in which the acoustic wave will be contained between the two electrodes that surround it. The structure 11 according to the disclosure will, therefore, be able to include, by way of example, an active layer 5 of aluminum nitride with a thickness of between 50 nm and 1 μm, advantageously 100 nm, and a dielectric layer 6 (for example, of silicon oxide) with a thickness of between 1 and 6 μm; the trapping layer 4 is arranged between the dielectric layer 6 and the support substrate 2. Insulation cavities are formed under the active layers of the filter, that is to say, the areas in which the acoustic waves will be required to be propagated.

The fabrication of the BAW filter then entails steps of depositions of electrodes to which the RF signal will be applied.

The structure 11 according to the disclosure makes it possible on the one hand to limit the depth of the insulation cavities whose insulation function relative to the substrate is made less critical by the high and stable resistivity of the support substrate and of the trapping layer; this is an advantage in terms of simplification, flexibility and robustness in the process of fabrication of these devices. Also, the structure 11 according to the disclosure makes it possible to obtain better performance levels in the filters, notably in terms of linearity.

According to a variant of this fifth embodiment, the microelectronic device 7 comprises a radiofrequency filter operating by surface acoustic wave (SAW) propagation.

The fabrication of an SAW filter requires an active layer 5 consisting of a piezoelectric material, on the surface of which will be created an electrode comb: the acoustic wave is intended to be propagated between these electrodes. The structure 11 according to the disclosure will, therefore, be able to include, by way of example, an active layer 5 of lithium tantalate with a thickness of between 200 nm and 20 μm, advantageously 0.6 μm; the trapping layer 4 is arranged between the active layer 5 and the support substrate 2. A dielectric layer 6 can optionally be added between the active layer 5 and the trapping layer 4.

The structure 11 according to the disclosure makes it possible to obtain better filter performance levels, notably in terms of insertion losses and of linearity.

The structure 1, 1', 11 for radiofrequency applications according to the disclosure is not limited to the embodiments cited above. It is suited to any application for which high-frequency signals propagate and are likely to undergo undesirable losses or disturbances in a support substrate, because the physical and electrical characteristics of the trapping layer 4 arranged on the support substrate 2 confer good RF properties on the assembly (limiting the losses, nonlinearities and other disturbances).

The invention claimed is:

1. A structure for radiofrequency applications comprising:

a support substrate of high-resistivity silicon comprising a non-doped lower part and a p-type doped upper part, the [p-typed] *p-type* doped upper part formed to a depth D of less than 1 [micro] *micron* in the support substrate; and a mesoporous trapping layer of silicon formed in the p-type doped upper part of the support substrate, the mesoporous trapping layer having a porosity rate of between 20% and 60% such that the mesoporous trapping layer traps inversion charges susceptible to be generated in the non-doped lower part and the non-doped lower part retains a high and stable resistivity level.

2. The structure of claim 1, wherein the mesoporous trapping layer has pores with a diameter of between 2 nm and 50 nm.

3. The structure of claim 2, wherein the resistivity of the non-doped lower part of the support substrate is greater than 1000 ohm·cm.

4. The structure of claim 1, wherein an active layer is disposed over the mesoporous trapping layer.

5. The structure of claim 4, wherein the active layer [compromises] *comprises* a semiconductive material.

6. The structure of claim 4, wherein the active layer [compromises] *comprises* a piezoelectric material.

7. The structure of claim 4, wherein the active layer comprises at least one material selected from the group consisting of: silicon, silicon carbide, silicon germanium, lithium niobate, lithium tantalate, quartz, and aluminum nitride.

8. The structure of claim 4, wherein [the] *a* thickness of the active layer is between 10 nm and 50 μm.

9. The structure of claim 4, wherein a dielectric layer is disposed between the mesoporous trapping layer and the active layer.

10. The structure of claim 9, wherein the dielectric layer comprises at least one material selected from the group consisting of: silicon dioxide, silicon nitride, and aluminum oxide.

11. The structure of claim 10, wherein the dielectric layer is between 10 nm and 6 μm.

12. The structure of claim 4, wherein at least one microelectronic device is present on or in the active layer, the microelectronic device being a switching circuit or an antenna tuning circuit or a radiofrequency power amplification circuit.

13. The structure of claim 4, wherein at least one microelectronic device is present on or in the active layer, the microelectronic device comprising a plurality of active components and a plurality of passive components.

14. The structure of claim 4, wherein at least one microelectronic device is present on or in the active layer, the microelectronic device comprising at least one control element and one MEMS switching element comprising a microswitch with ohmic contact or a capacitive microswitch.

15. The structure of claim 4, wherein at least one microelectronic device is present on or in the active layer, the microelectronic device comprising a radiofrequency filter operating by bulk or surface acoustic wave propagation.

16. The structure of claim 1, wherein the resistivity of the non-doped lower part of the support substrate is greater than 1000 ohm·cm.

17. The structure of claim 1, wherein an active layer is [arranged] *disposed* on the mesoporous trapping layer.

18. The structure of claim 9, wherein the dielectric layer is between 10 nm and 6 μm.

*19. A surface acoustic wave device, comprising:*

*a support substrate of high-resistivity silicon comprising a lower portion and an upper portion, wherein silicon in the upper portion of the support substrate has been modified to form a charge trapping layer;*

*a piezoelectric material bonded over a top surface of the support substrate, and having a thickness between 10 nm and 50 microns; and*

*an electrode comb disposed on a surface of the piezoelectric material;*

*wherein the charge trapping layer traps mobile charges generated in the upper portion of the support substrate in order to maintain a high and stable resistivity level in the upper portion of the support substrate.*

*20. The surface acoustic wave device of claim 19, wherein the piezoelectric material comprises at least one material selected from the group consisting of: silicon, silicon carbide, silicon germanium, lithium niobate, lithium tantalate, quartz, and aluminum nitride.*

*21. The surface acoustic wave device of claim 20, wherein the piezoelectric material is lithium tantalate.*

*22. The surface acoustic wave device of claim 21, wherein the lithium tantalate has a thickness between 200 nm and 20 μm.*

*23. The surface acoustic wave device of claim 19, wherein the charge trapping layer has a thickness below 1 μm.*

*24. The surface acoustic wave device of claim 19, wherein the charge trapping layer comprises high-resistivity silicon having p-type doping.*

*25. The surface acoustic wave device of claim 19, wherein the charge trapping layer comprises high-resistivity silicon having a porous layer.*

*26. The surface acoustic wave device of claim 25, wherein the porous layer comprises pores having a pore diameter less than 50 nm.*

*27. The surface acoustic wave device of claim 25, wherein the porous layer comprises pores having a pore diameter between 2 nm and 50 nm.*

*28. The surface acoustic wave device of claim 25, wherein the porous layer comprises pores having a pore diameter greater than 2 nm.*

*29. The surface acoustic wave device of claim 19, wherein at least one microelectronic device is present on or in the piezoelectric material.*

*30. The surface acoustic wave device of claim 29, wherein the at least one microelectronic device comprises at least one component selected from the group consisting of: a switching circuit, an antenna tuning circuit, and a radiofrequency power amplification circuit.*

*31. The surface acoustic wave device of claim 19, further comprising a dielectric disposed between the piezoelectric material and the charge trapping layer.*

*32. The surface acoustic wave device of claim 31, wherein the dielectric comprises silicon oxide.*

*33. The surface acoustic wave device of claim 19, wherein a resistivity of the support substrate is greater than 4000 ohm-cm.*

*34. A surface acoustic wave device, comprising:*

*a high-resistivity silicon support substrate;*

*a charge trapping material disposed on the support substrate;*

*a dielectric material disposed on the charge trapping material;*

*a piezoelectric material disposed on the dielectric material and having a thickness between 10 nm and 50 microns; and*

*electrode comb elements configured to propagate an acoustic wave between them, and disposed on a surface of the piezoelectric material;*

*wherein the charge trapping layer is configured to trap mobile charges generated in a portion of the support substrate during operation of the surface acoustic wave device.*

*35. The surface acoustic wave device of claim 34, wherein the piezoelectric material is lithium tantalate.*

*36. The surface acoustic wave device of claim 34, wherein the dielectric material has a thickness between 10 nm and 6 μm.*

*37. A method of manufacturing a surface acoustic wave device, comprising:*

*providing a support substrate;*

*modifying a top portion of the support substrate to form a charge trapping layer, the charge trapping layer configured to trap mobile charges generated in a portion of the support substrate during operation of the surface acoustic wave device;*

*disposing a dielectric layer on the charge trapping layer;*

*direct bonding a piezoelectric layer on the dielectric layer by disposing a donor substrate by molecular adhesion directly on the charge trapping layer, and thinning the donor substrate to a desired thickness of the piezoelectric layer of between 10 nm and 50 microns; and*

*disposing an electrode comb on a surface of the piezoelectric material.*

*38. The method of claim 37, wherein direct bonding the piezoelectric layer on the dielectric layer comprises direct bonding lithium tantalate on the dielectric layer.*

*39. The method of claim 38, wherein direct bonding the lithium tantalate on the dielectric layer comprises direct bonding the lithium tantalate at a thickness between 200 nm and 20 μm on the dielectric layer.*

*40. The method of claim 37, wherein modifying the top portion of the support substrate to form the charge trapping layer comprises rendering the top portion of the support substrate a porous layer.*

*41. The method of claim 40, wherein rendering the top portion of the support substrate the porous layer comprises forming pores having a pore diameter between 2 nm and 50 nm.*

*42. The method of claim 37, wherein the dielectric layer comprises at least one material selected from the group consisting of: silicon dioxide, silicon nitride, and aluminum oxide.*

*43. The method of claim 37, wherein the dielectric layer is between 10 nm and 6 μm.*

*44. The method of claim 37, further comprising disposing another dielectric layer on the piezoelectric layer before direct bonding the piezoelectric layer on the dielectric layer.*

* * * * *